(12) United States Patent
Roth et al.

(10) Patent No.: US 11,315,892 B2
(45) Date of Patent: Apr. 26, 2022

(54) POWER SEMICONDUCTOR DEVICE LOAD TERMINAL

(71) Applicant: Infineon Technologies AG, Neubiberg (DE)

(72) Inventors: Roman Roth, Sattendorf (AT); Frank Hille, Munich (DE); Hans-Joachim Schulze, Taufkirchen (DE)

(73) Assignee: Infineon Technologies AG

( * ) Notice: Subject to any disclaimer, the term of this patent is extended or adjusted under 35 U.S.C. 154(b) by 152 days.

(21) Appl. No.: 16/059,468

(22) Filed: Aug. 9, 2018

(65) Prior Publication Data

US 2018/0366428 A1     Dec. 20, 2018

Related U.S. Application Data

(63) Continuation of application No. 15/420,815, filed on Jan. 31, 2017, now Pat. No. 10,079,217.

(30) Foreign Application Priority Data

Feb. 2, 2016    (DE) ..................... 10 2016 101 801.5

(51) Int. Cl.
     *H01L 23/00*      (2006.01)
     *H01L 23/532*     (2006.01)
     *H01L 21/768*     (2006.01)

(52) U.S. Cl.
     CPC ........ *H01L 24/05* (2013.01); *H01L 21/76841* (2013.01); *H01L 23/53223* (2013.01);

(Continued)

(58) Field of Classification Search
     CPC ......... H01L 24/03; H01L 24/05; H01L 24/06; H01L 24/48; H01L 24/49;

(Continued)

(56) References Cited

U.S. PATENT DOCUMENTS 4,562,511 A     12/1985   Nishino et al.
4,782,380 A *   11/1988   Shankar ............ H01L 23/53223
                                                              257/751

(Continued)

FOREIGN PATENT DOCUMENTS

DE      102013222816 A1    5/2015
JP        H0677232 A        3/1994

(Continued)

*Primary Examiner* — Tuan A Hoang
(74) *Attorney, Agent, or Firm* — Design IP

(57) ABSTRACT

A power semiconductor device, a power semiconductor module and a power semiconductor device processing method are provided. The power semiconductor device includes a first load terminal structure, a second load terminal structure, and a semiconductor structure electrically coupled to each load terminal structure and configured to carry a load current. The first load terminal structure includes a conductive layer in contact with the semiconductor structure, a bonding block configured to be contacted by at least one bond wire and to receive at least a part of the load current from the at least one bond wire and/or the conductive layer, a support block having a hardness greater than the hardness of the conductive layer and the bonding block. The bonding block is mounted on the conductive layer via the support block, and a zone is arranged within the conductive layer and/or the bonding block, the zone exhibiting nitrogen atoms.

37 Claims, 5 Drawing Sheets

(52) U.S. Cl.
CPC .............. *H01L 24/03* (2013.01); *H01L 24/06* (2013.01); *H01L 24/48* (2013.01); *H01L 24/49* (2013.01); *H01L 2224/0219* (2013.01); *H01L 2224/02181* (2013.01); *H01L 2224/0347* (2013.01); *H01L 2224/03462* (2013.01); *H01L 2224/03848* (2013.01); *H01L 2224/04042* (2013.01); *H01L 2224/0566* (2013.01); *H01L 2224/05083* (2013.01); *H01L 2224/05124* (2013.01); *H01L 2224/05147* (2013.01); *H01L 2224/05166* (2013.01); *H01L 2224/05181* (2013.01); *H01L 2224/05184* (2013.01); *H01L 2224/05618* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/0603* (2013.01); *H01L 2224/45099* (2013.01); *H01L 2224/48091* (2013.01); *H01L 2224/491* (2013.01); *H01L 2224/4911* (2013.01); *H01L 2924/00014* (2013.01); *H01L 2924/01007* (2013.01); *H01L 2924/01013* (2013.01); *H01L 2924/01014* (2013.01); *H01L 2924/01022* (2013.01); *H01L 2924/01029* (2013.01); *H01L 2924/01073* (2013.01); *H01L 2924/01074* (2013.01); *H01L 2924/1033* (2013.01); *H01L 2924/10253* (2013.01); *H01L 2924/10272* (2013.01); *H01L 2924/10329* (2013.01); *H01L 2924/1203* (2013.01); *H01L 2924/1301* (2013.01); *H01L 2924/13055* (2013.01); *H01L 2924/13091* (2013.01)

(58) Field of Classification Search
CPC ......... H01L 21/76841; H01L 23/53223; H01L 29/7827; H01L 2224/05147; H01L 2224/05166; H01L 2224/05083
See application file for complete search history.

(56) References Cited

U.S. PATENT DOCUMENTS

| | | | |
|---|---|---|---|
| 4,819,215 A | 4/1989 | Yokoyama et al. | |
| 5,498,572 A | 3/1996 | Shiga et al. | |
| 5,561,083 A * | 10/1996 | Bollinger | H01L 23/4827 438/653 |
| 5,990,498 A | 11/1999 | Chapnik et al. | |
| 6,430,031 B1 | 8/2002 | Dispennette et al. | |
| 6,441,489 B1 | 8/2002 | Motoyama | |
| 6,566,250 B1 * | 5/2003 | Tu | H01L 21/288 257/E21.174 |
| 6,730,539 B2 | 5/2004 | Park et al. | |
| 7,015,580 B2 * | 3/2006 | Fitzsimmons | H01L 24/05 257/739 |
| 7,056,820 B2 | 6/2006 | Cole et al. | |
| 7,153,758 B2 | 12/2006 | Hata et al. | |
| 7,737,560 B2 | 6/2010 | Stecher et al. | |
| 7,964,961 B2 * | 6/2011 | Lee | H01L 23/49531 257/737 |
| 8,164,173 B2 | 4/2012 | Koller et al. | |
| 8,643,176 B2 | 2/2014 | Otremba et al. | |
| 9,041,007 B2 | 5/2015 | Suekawa et al. | |
| 9,072,464 B2 | 7/2015 | Haartsen et al. | |
| 9,570,676 B2 | 2/2017 | Kolb et al. | |
| 9,653,671 B2 | 5/2017 | Munding | |
| 2001/0020545 A1 | 9/2001 | Eldridge et al. | |
| 2003/0107137 A1 * | 6/2003 | Stierman | B81B 7/0006 257/763 |
| 2003/0178672 A1 * | 9/2003 | Hatakeyama | H01L 29/7392 257/328 |
| 2005/0029584 A1 * | 2/2005 | Shiraishi | H01L 29/66727 257/329 |
| 2006/0097407 A1 * | 5/2006 | Ito | H01L 24/06 257/784 |
| 2007/0164412 A1 * | 7/2007 | Lee | H01L 24/03 257/678 |
| 2009/0243105 A1 * | 10/2009 | Lehr | H01L 24/48 257/751 |
| 2010/0020469 A1 | 1/2010 | Kurioka et al. | |
| 2010/0133688 A1 | 6/2010 | Shigihara et al. | |
| 2010/0200974 A1 | 8/2010 | Weng et al. | |
| 2011/0233405 A1 * | 9/2011 | Horsfall | G01T 1/244 250/336.1 |
| 2014/0061531 A1 * | 3/2014 | Faur | C23F 1/16 252/79.3 |
| 2014/0220749 A1 | 8/2014 | Rutter | |
| 2014/0367859 A1 | 12/2014 | Carpenter et al. | |
| 2015/0162385 A1 * | 6/2015 | Dittmar | H01L 27/15 257/40 |
| 2015/0228878 A1 | 8/2015 | Munding | |
| 2016/0005687 A1 | 1/2016 | Fajardo et al. | |
| 2016/0111346 A1 | 4/2016 | Hoeglauer et al. | |
| 2016/0141216 A1 | 5/2016 | Pagani | |
| 2017/0125322 A1 | 5/2017 | Spann et al. | |
| 2017/0243887 A1 | 8/2017 | Molin et al. | |

FOREIGN PATENT DOCUMENTS

| | | |
|---|---|---|
| JP | H07030095 A | 1/1995 |
| JP | H10340920 A | 12/1998 |
| JP | 2000277520 A | 10/2000 |
| JP | 2003031588 A | 1/2003 |
| JP | 2006237394 A | 9/2006 |
| JP | 2007266483 A | 10/2007 |
| JP | 2010157683 A | 7/2010 |
| JP | 2012129503 A | 7/2012 |
| JP | 2014082367 A | 5/2014 |
| JP | 2015026669 A | 2/2015 |
| JP | 2015144168 A | 8/2015 |

* cited by examiner

POWER SEMICONDUCTOR DEVICE LOAD TERMINAL

CROSS REFERENCE TO RELATED APPLICATION(S)

This application is a continuation of U.S. patent application Ser. No. 15/420,815, filed Jan. 31, 2017, which claims the benefit of German Patent Application No. 10 2016 101 801.5 filed Feb. 2, 2016, which are incorporated by reference as if fully set forth.

FIELD

This specification refers to embodiments of a power semiconductor device, a power semiconductor module and a power semiconductor device processing method. In particular, this specification relates to an enforced load terminal structure for a power semiconductor device and to methods of manufacturing such enforced load terminal structure.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor structure configured to conduct a load current along a load current path between two load terminal structures of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state and a blocking state.

The semiconductor device may be integrated into a load current transmission path that may include cables, wires and so forth. For interfacing the semiconductor structure with said components of the load current transmission path, at least one of said load terminal structures may comprise a contact pad or the like configured to be contacted by one or more bond wires.

Occasionally, establishing contact between a bond wire and a load terminal structure—commonly referred to as bonding—involves inducing mechanical stress within the load terminal structure.

SUMMARY

According to an embodiment, a power semiconductor device comprising a first load terminal structure and a second load terminal structure arranged separately from the first load terminal structure; a semiconductor structure electrically coupled to each of the first load terminal structure and the second load terminal structure and configured to carry a load current. The first load terminal structure comprises: a conductive layer in contact with the semiconductor structure; a bonding block configured to be contacted by an end of at least one bond wire and to receive at least a part of the load current from at least one of the at least one bond wire and the conductive layer; a support block having a hardness greater than the hardness of each of the conductive layer and the bonding block, wherein the bonding block is mounted on the conductive layer via the support block; and a zone that is arranged within at least one of the conductive layer and the bonding block, the zone exhibiting nitrogen atoms.

According to a further embodiment, a power semiconductor module comprises a power semiconductor device, at least one bond wire and a packaging. The power semiconductor device comprises: a first load terminal structure and a second load terminal structure arranged separately from the first load terminal structure; a semiconductor structure electrically coupled to each of the first load terminal structure and the second load terminal structure and configured to carry a load current. The first load terminal structure comprises: a conductive layer in contact with the semiconductor structure; a bonding block configured to be contacted by an end of the at least one bond wire and configured to receive at least a part of the load current from at least one of the at least one bond wire and the conductive layer; a support block having a hardness greater than the hardness of each of the conductive layer and the bonding block, wherein the bonding block is mounted on the conductive layer via the support block; and a zone that is arranged within at least one of the conductive layer and the bonding block, the zone exhibiting nitrogen atoms. The packaging at least partially surrounds the power semiconductor device and comprises a load current interface that is contacted by the other end of the at least one bond wire.

According to a yet further embodiment, a method of processing a power semiconductor device comprises the method comprising providing a semiconductor structure having a surface and creating a first load terminal structure on top of the surface. Said creating includes: forming a conductive layer that is in contact with the semiconductor structure at said surface; depositing at least one support block on top of the conductive layer; forming a zone exhibiting nitrogen atoms and being arranged within at least one of the conductive layer and the bonding block; and mounting a bonding block on top of the at least one support block. The at least one support block exhibits a hardness greater than the hardness of each of the conductive layer and the bonding block. The bonding block is configured to be contacted by an end of a at least one bond wire and to receive at least a part of a load current from at least one of the at least one bond wire and the conductive layer.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

Figure 1:
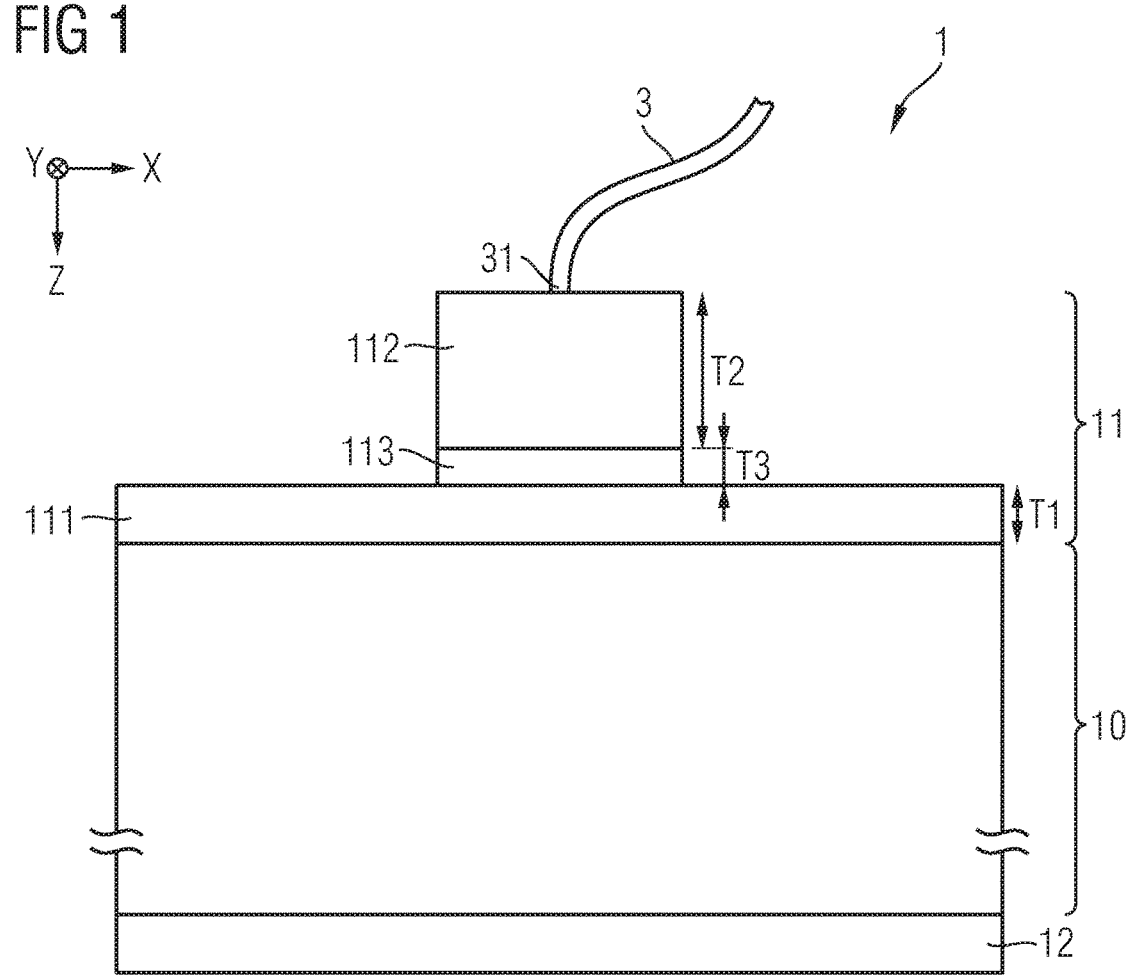
FIG. 1 schematically illustrates a section of a vertical cross-section of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be a extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a stripe cell or needle cell configuration, such as a power semiconductor transistor, that may be used within a power converter or a power supply. Thus, in an embodiment, the semiconductor device is configured to carry a load current that is to be fed to a load and/or, respectively, that is provided by a power source. For example, the semiconductor device may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. Such diode cell and/or such transistor cells may be integrated in a power semiconductor module. A plurality of such cells may constitute a cell field that is arranged within an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above. For example, the processed semiconductor device described below may be a semiconductor device exhibiting a stripe cell configuration or a needle cell configuration and can be configured to be employed as a power component in a low-, medium- and/or high voltage application.

FIG. 1 schematically illustrates a section of a vertical cross-section of a power semiconductor device 1—in the following referred to as "semiconductor device"—in accordance with one or more embodiments.

The illustrated vertical cross-section is in parallel to a plane defined by a first lateral direction X and an extension direction Z perpendicular thereto. The semiconductor device 1 or, respectively, components thereof may certainly also extend along a second lateral direction Y that is perpendicular to each of the first lateral direction X and the extension direction Z.

The semiconductor device 1 comprises a semiconductor structure 10, e.g., a semiconductor body, coupled to a first load terminal structure 11 and a second load terminal structure 12. In the illustrated embodiment, the semiconductor device 1 exhibits a substantially vertical set-up, according to which the second load terminal structure 12 can be arranged on a backside of the semiconductor structure 10 and according to which the first load terminal structure 11 can be arranged on a front side of the semiconductor structure 10. However, it shall be understood that the semiconductor device 1 may also exhibit a substantial lateral set-up, according to which, e.g., each of the first load terminal structure 11 and the second load terminal structure 12 are arranged on the same side of the semiconductor structure 10.

The semiconductor structure 10 can be configured to carry a load current, e.g., between the first load terminal structure 11 and the second load terminal structure 12 of the semiconductor device 1. To this end, each of first load terminal structure 11 and the second load terminal structure 12 may be electrically connected to the semiconductor structure 11. In an embodiment, the load current is received by means of the first load terminal structure 11 and output by the second load terminal structure 12 and/or vice versa. In another embodiment, the first load terminal structure is used as a control terminal structure for controlling flow of the load current.

For example, the semiconductor structure 10 is configured to carry a load current of at least 10 A, of at least 50 A or a load current that is greater than 100 A.

For example, in order to implement the load current carrying capability of the semiconductor structure 10, the semiconductor structure 10 may comprise one or more diode cells and/or transistor cells. Such cells are not illustrated in the Figures, since their exact configuration is presently of less importance. Rather, the semiconductor structure 10 may exhibit principally any arbitrary transistor structure and/or diode structure that is nowadays and in the future used, including, but not limited to an IGBT, a MOSFET, a MOS gated diode, and/or a diode structure, a thyristor structure, etc., to name a few. To this end, the semiconductor structure 10 may comprise one or more first regions having dopants of a first conductivity type and one or more second regions having dopants of a second conductivity type complementary to the first conductivity type. In an embodiment, at least one of such first semiconductor regions and second semiconductor regions is electrically connected to the first load terminal structure 11.

Further, in order to control flow of the load current within the semiconductor structure 10, the semiconductor device 1 may further comprise a control electrode structure that is electrically insulated from the semiconductor structure 10. For example, such control electrode structure may comprise at least one gate electrode that is configured to receive a control signal from external of the semiconductor structure 10 and to set the semiconductor device 1 into one of a conducting state and the blocking state.

For example, the second load terminal structure 12 may comprise a backside metallization that may be in electrically connected to one or more sections of the semiconductor structure 10, e.g., highly doped semiconductor contact layer (not illustrated).

Figure 2:
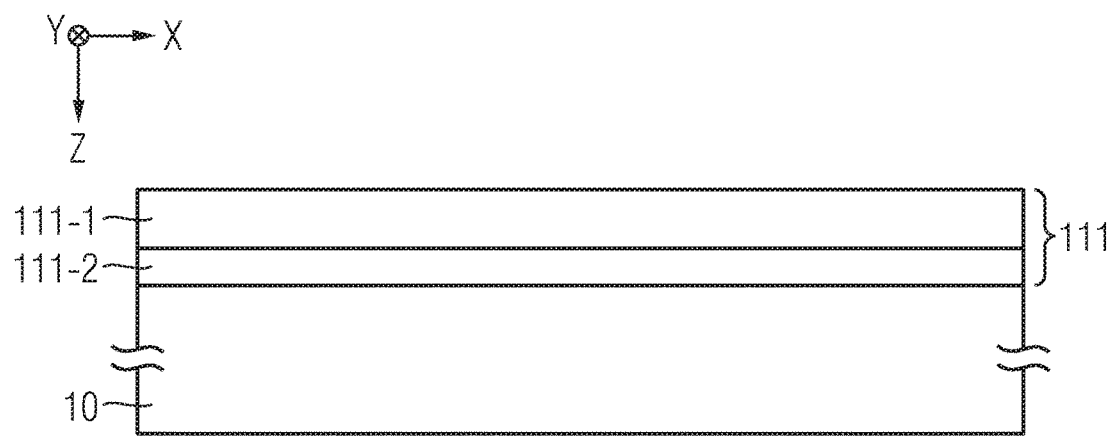
FIG. 2 schematically illustrates a section of a vertical cross-section of a conductive layer of a power semiconductor device in accordance with one or more embodiments.

The first load terminal structure 11 may comprise a conductive layer 111 that is in contact with the semiconductor structure 10. For example, as illustrated in FIG. 2, the conductive layer 111 comprises a diffusion barrier 111-2 and a metallization 111-1, wherein the diffusion barrier 111-2 couples the front side metallization 111-1 to the semiconductor structure 10.

For example, the diffusion barrier 111-2 comprises at least one of titanium, tungsten, titanium tungsten, titanium nitride, tantalum, and tantalum nitride. The diffusion barrier 111-2 may be configured to prevent metal or the like from diffusing from the first load terminal structure 11 into the semiconductor structure 10.

The metallization 111-1 may comprise at least one of copper, silver, gold, palladium, zinc, nickel and iron, and aluminum.

The first load terminal structure 11 may further comprise a support block 113 that may be mounted on top of the conductive layer 111. For example, the support block 113 has a hardness that is greater than the hardness of the conductive layer 111, e.g., a hardness that is higher than the metallization 111-1. To this end, the support block 113 may comprise at least one of titanium, tungsten, titanium tungsten, titanium nitride, tantalum, and tantalum nitride. For example, the support block 113 covers entirely the total surface of the conductive layer 111 or, respectively, only a portion of the total surface of the conductive layer 111, e.g., a portion in the range from 5% to 95% of the total surface area of the conductive layer 111. Thus, the support block 113 may exhibit a cross-section having an area being within a range of 5% to 95% of the total surface area of the conductive layer 111, wherein said cross-section may be in parallel to the surface of the conductive layer 111. Further, said range may be smaller, e.g., 10% to 90% or 20% to 80%.

Figure 6:
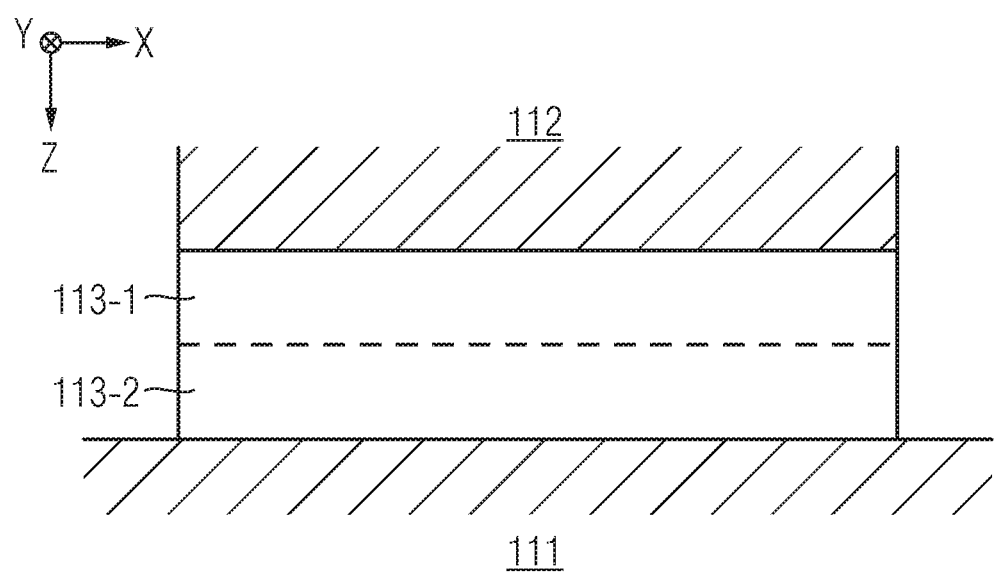
FIG. 6 schematically illustrates a section of a vertical cross-section of a support block of a power semiconductor device in accordance with one or more embodiments.

Further, as schematically illustrated in FIG. 6, the support block 113 may comprise a first sublayer 113-1 and a second sublayer 113-2, wherein the first sublayer 113-1 may be in contact with the bonding block 112 and the second sublayer 113-2 may be in contact with the conductive layer 111. For example, the first sublayer 113-1 comprises a metal different from a metal that may be included in the second sublayer 113-2. For example, the first sublayer 113-1 is made of one of titanium, tungsten, titanium tungsten, titanium nitride, tantalum, and tantalum nitride and the second sublayer 113-2 is made of another one of titanium, tungsten, titanium tungsten, titanium nitride, tantalum, and tantalum nitride. Further, the support block 113 may comprise more than two sublayers, such as an additional third sublayer (not illustrated), wherein such additional third sublayer may comprise yet another one of titanium, tungsten, titanium tungsten, titanium nitride, tantalum, and tantalum nitride.

The first load terminal structure 11 may further comprise a bonding block 112 that is configured to be contacted by an end 31 of a bond wire 3 and configured to receive at least a part of the load current from at least one of the bond wire 31 and the conductive layer 111. For example, the bonding block 112 also comprises at least one of copper, silver, gold, palladium, zinc, nickel and iron, and aluminum. In an embodiment, the bonding block 112 forms a contacting pad configured to be contacted by one or more bond wires 3.

In an embodiment, the bonding block 112 not only covers at least a portion of the surface of the support block 113, but also at least a portion of the surface of the conductive layer 111 that is not covered by the support block 113. Thus, the total surface of the bonding block 112 that is in parallel to each of the first lateral direction X and the second lateral direction Y may be greater than the total surface of the support block 113 that is in parallel to each of the first lateral direction X and the second lateral direction Y.

Thus, within the present specification, the formulation stating that "the bonding block 112 is mounted on the conductive layer 111 via the support block 113" may also address such situations in which the horizontal plane of the bonding block 112 is greater than the horizontal plane of the support block and in which the bonding block 112 may thus also be in contact with the conductive layer at regions into which the support block 113 does not extend, in accordance with one or more embodiments.

In an embodiment, the bonding block 112 and at least a part of the conductive layer 111, e.g., the metallization 111-1, comprise the same metal, e.g., are made out of the same material. Thus, the hardness of the support block 113 may also be greater than the hardness of the bonding block.

In an embodiment, the support block 113 exhibits a hardness of at least 5.0 on the Mohs scale. The hardness can be even greater that 5.0 on the Mohs scale, e.g., greater than 6.0, greater than 7.0 or even greater than 8.0 or yet greater than 9.0 on the Mohs Scale. In contrast, the hardness of each of the conductive layer 111 and the bonding block 112 may be lower than 5.0 on the Mohs Scale, e.g., lower than 4.0 on the Mohs Scale or even lower than 3.0 on the Mohs Scale or even lower than 2.0 on the Mohs Scale.

It shall be understood that, within the present specification, the term "hardness" is used to express a mean hardness of the respective component of the semiconductor device 1. For example, as stated above, the conductive layer 111 may comprise a diffusion barrier 111-2 that may exhibit a hardness that is different from the hardness of the metallization 111-1 of the conductive layer 111. Thus, for example, the hardness of the conductive layer 111 may be in between the hardness of the diffusion barrier 111-2 and the hardness of the metallization 111-1. Analogously, the hardness of the support block 113 may be in between the hardness of the first sublayer 113-1 and the hardness of the second sublayer 113-2, in accordance with the exemplary embodiment of FIG. 6.

Further, there are many physical units that may express the hardness of a component, wherein there exist further different types of hardness, such as the so-called scratch hardness, the indentation hardness and the rebound hardness. Each of these classes may be expressed with one or more individual measurement scales, i.e., in different physical units. One of such scales is the above-mentioned Mohs scale. However, it shall be understood that the different degrees of hardness of the support block 113 with respect to the hardness of the conductive layer 111 and the bonding block 112 may also be expressed using another measurement scale, such as the known Rockwell scale, the Brinell scale, the Vickers scale and/or the shore Cell.

Thus, in an embodiment, irrespective of the measurement scale used to express the hardness of the support block 113, the support block 113 exhibits a hardness that is at least 20% or 50% or even at least twice as great as the hardness of the conductive layer 111 and/or of the bonding block 112. In another embodiment, this factor can be even greater than 2, such as 3, 4, 5 or even greater than 5. However, it shall be understood that the difference between the hardness of the support block 113 and the hardness of the conductive layer 111 may be different from the difference between the hardness of the support block 113 and the hardness of the bonding block 112. Thus, in an embodiment, the hardness of the conductive layer 111 may be different from the hardness of the bonding block 112. In another embodiment, the hardness of the conductive layer 111 may be identical to the hardness of the bonding block 112 such that the above mentioned differences in hardness with respect to the hardness of the support block 113 may also be identical to each other.

Further, as schematically illustrated in FIG. 1, the thickness of the support block 113 in a direction in parallel to the flow of the load current may be significantly smaller as compared to the thickness of the bonding block 112 along the same direction, which is substantially the extension direction Z in the embodiment illustrated in FIG. 1.

For example, the thickness T3 of the support block 113 is smaller than a tenth of the thickness T2 of the bonding block 112. Further, also the thickness T1 of the conductive layer 111 may be smaller than a tenth of the thickness T2 of the bonding block 112.

In an embodiment, the thickness T1 of the conductive layer 111 is in the range of 200 nm to 10 μm along said direction of the flow of the load current. The thickness T3 of the support block 113 may be in the range of 50 nm to 2000 nm along said direction.

As illustrated in FIG. 1, the conductive layer 111, the support block 113 and the bonding block 112 may form an electrically conductive stack that may extend in parallel to the direction of the flow of the load current within the support block 113. The bonding block 112 may be mounted on the support block 113 and the support block 113 may be mounted on the conductive layer 111. The load current may be received by the end 31 of the bond wire 3 and may pass the conductive stack and may then enter the semiconductor structure 10 and may leave the semiconductor structure 10 by means of the second load terminal structure 12. However, in another embodiment, the flow of the load current may additionally or alternatively occur in the opposite direction and, further, the semiconductor structure 10 may be configured to conduct the load current in each of said directions. Further, it shall be understood that the bonding block 112 may be configured to be contacted by more than only one bond wire 3, such as 2 bond wires, 3 bond wires, or even more than 5 bond wires, such as 30 bond wires.

In an embodiment, the bonding block 112 and the conductive layer 111 may comprise the same metal, such as copper.

In an embodiment, the first load terminal structure 11 further comprises a zone (not separately illustrated in the drawings) that is arranged within at least one of the conductive layer 111 and the support block 113, wherein the zone exhibits nitrogen atoms. For example, the zone exhibits a maximum nitrogen atom concentration of more than 1e14 $cm^{-3}$, or of more than 5e14 $cm^{-3}$, of more than 2e15 $cm^{-3}$, of more than 5e15 $cm^{-3}$, or of even more than 2e16 $cm^{-3}$.

In an embodiment, the zone can be arranged such that at least one of the conductive layer 111 and the support block 113 exhibits a maximum nitrogen atom concentration of more than 1e14 $cm^{-3}$, or of more than 5e14 $cm^{-3}$, of more than 2e15 $cm^{-3}$, of more than 5e15 $cm^{-3}$, or of even more than 2e16 $cm^{-3}$.

For example, the zone exhibits a lateral cross-section with an area of at least 50% of the area of the lateral cross-section of the support block 113 or of at least 50% of the area of the lateral cross-section of the conductive layer 111. Said respective percentage maybe even greater than 50%, e.g., greater than 75%, greater than 85% or even substantially be equal to 100%. Thus, in an embodiment, a section of the zone being arranged within the support block 113 may exhibit equal lateral dimensions (X-direction and Y-direction) as compared to the support block 113 or, respectively, a section of the zone being arranged within the conductive layer 111 may exhibit equal lateral dimensions (X-direction and Y-direction) as compared to the conductive layer 111.

In an example, the zone is arranged within the diffusion barrier 111-2 and exhibits a maximum nitrogen atom concentration of more than 1e14 cm$^{-3}$. The maximum nitrogen atom concentration can also be higher than that, e.g., higher than 5e14 cm$^{-3}$, higher than 2e15 cm$^{-3}$, higher than 5e15 cm$^{-3}$, or even higher than 2e16 cm$^{-3}$. The zone may be arranged within the diffusion barrier 111-2 such that the aforementioned maximum nitrogen atom concentration relations may be present in the diffusion barrier 111-2.

Further, in the example where the zone is arranged within the diffusion barrier 111-2, the diffusion barrier 111-2 may comprise a multi-layer stack of the same or of different barrier materials. The barrier materials may comprise at least one of titanium (Ti), tungsten (W), tantalum (Ta), titanium tungsten (TiW), titanium nitrogen (TiN), aluminium (Al), aluminium copper (AlCu), aluminium silicon copper (AlSiCu).

In another example, the zone is arranged, additionally or alternatively to the aforementioned example, within a section of the support block 113 that is in proximity to a transition to the bonding block 112. In an embodiment, nitrogen atoms may also or alternatively be provided at a transition between the diffusion barrier 111-2 and the metallization 111-1.

For example, nitrogen atoms may be provided, e.g., by means of carrying out a thermal annealing step, such as a rapid thermal annealing step. Thereby, a defined dose of nitrogen atoms, e.g., said maximum nitrogen atom concentration relations exemplary mentioned above, may be provided in a designated area, e.g., in an area of grain boundaries of at least one of the support block 113 and the diffusion barrier 111-2.

Subsequently to providing nitrogen atoms, TiW and Cu may be provided, e.g., by sputtering, at the same area where the nitrogen atoms have been previously provided.

Figure 5:
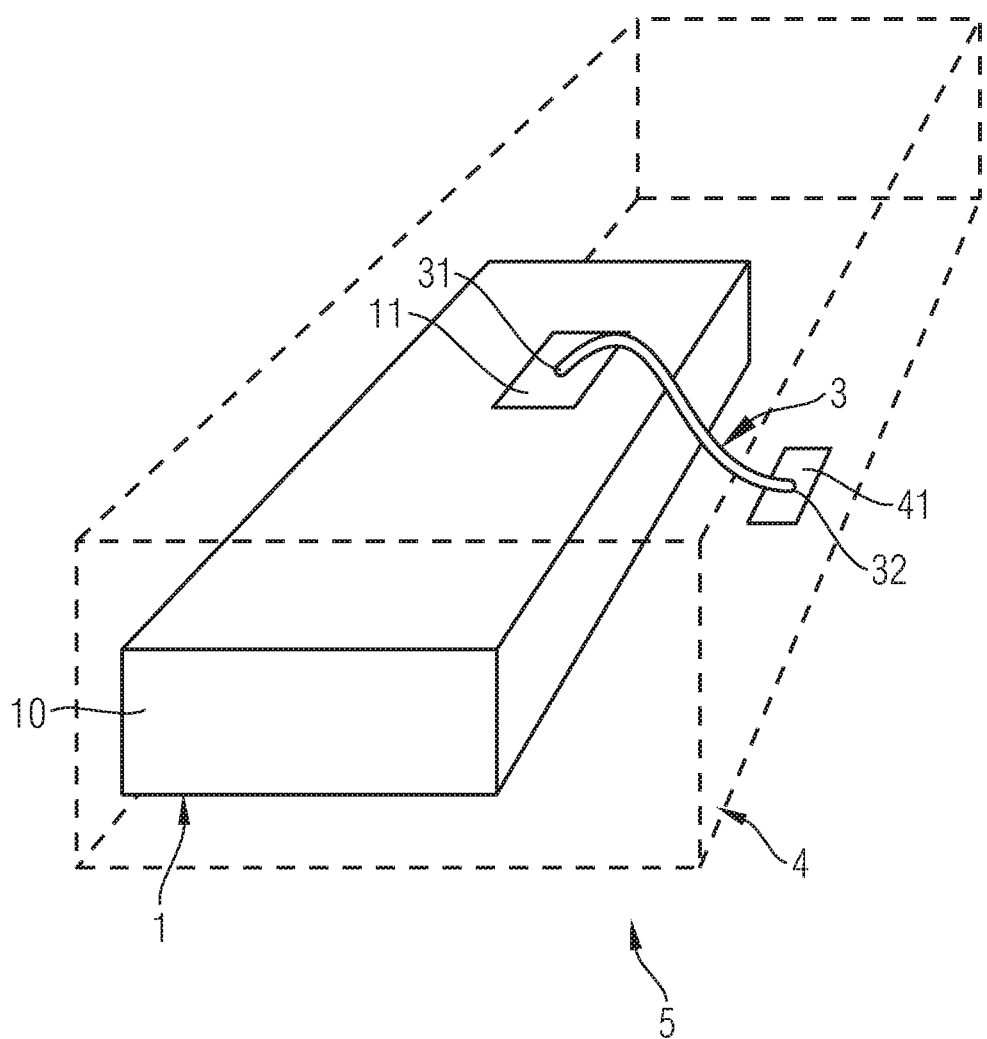
FIG. 5 schematically illustrates a section of a perspective view on a power semiconductor module in accordance with one or more embodiments.

FIG. 5 illustrates a perspective view on a semiconductor module 5 in accordance with one or more embodiments. The semiconductor module 5 may comprise a packaging 4 that may house a semiconductor device 1 e.g., a semiconductor device 1 exhibiting a configuration as it has been exemplarily explained with respect to FIG. 1 and FIG. 2.

Accordingly, the semiconductor device 1 of the semiconductor module 5 may comprise a semiconductor structure 10 configured to carry a load current and a first load terminal structure 11 that is contacted by an end 31 of a bond wire 3 that may be part of the power semiconductor module 5.

The packaging 4 may at least partially surround the semiconductor device 1 and comprise a load current interface 41 that is contacted by the other end 32 the end of the bond wire 3. As has already been indicated above, it shall be understood that the interconnection between the first load terminal structure 11 and the load current interface 41 may be established by more than one bond wire 3.

In an embodiment, the power semiconductor module 5 may be configured to be integrated into a load current transmission path (not illustrated in FIG. 5) that may include a power semiconductor device stack, a rack and components usually employed within such structures, such as cables, wires and so forth. For interfacing the power semiconductor module 5 with such components of the load current transmission path, said load current interface 41 may be employed, in accordance with one or more embodiments.

The packaging 4 may comprise one or more mechanical terminals (not illustrated) that may allow for mechanically mounting the packaging 4, e.g., within a system rack of a power converted or something alike. The packaging 4 may comprise an electrical insulating material.

Figure 4:
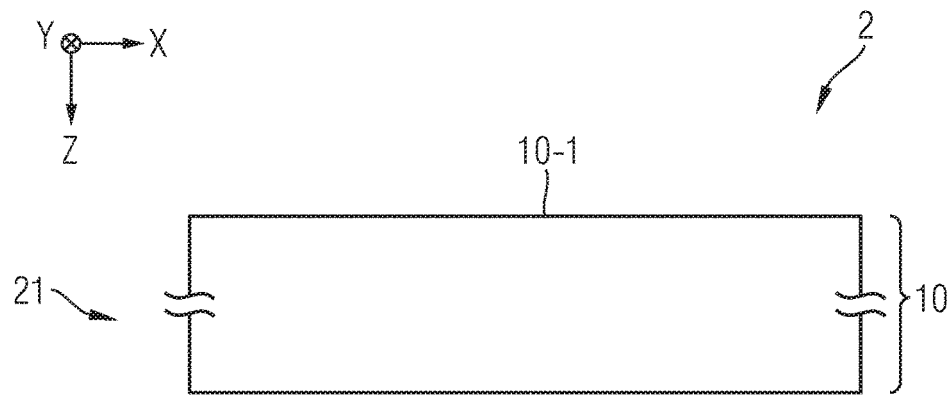
FIG. 4 schematically illustrates different stages of a power semiconductor device processing method by means of a respective schematic illustration of a section of vertical cross-section of a power semiconductor device in accordance with one or more embodiments.
Figure 4:
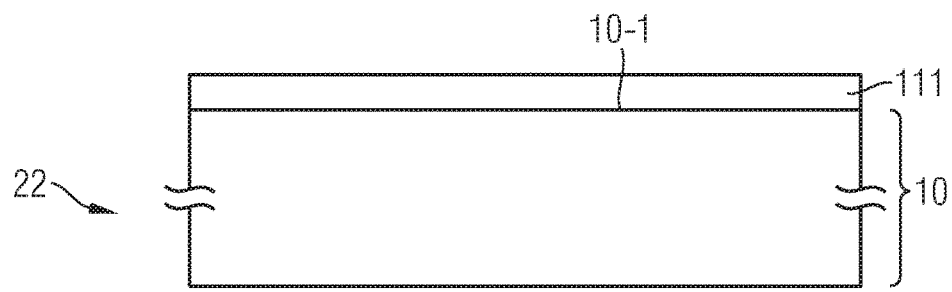
Figure 4:
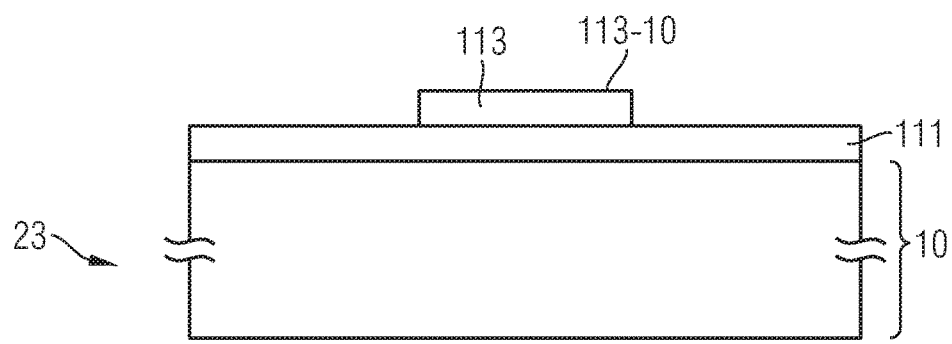
Figure 4:
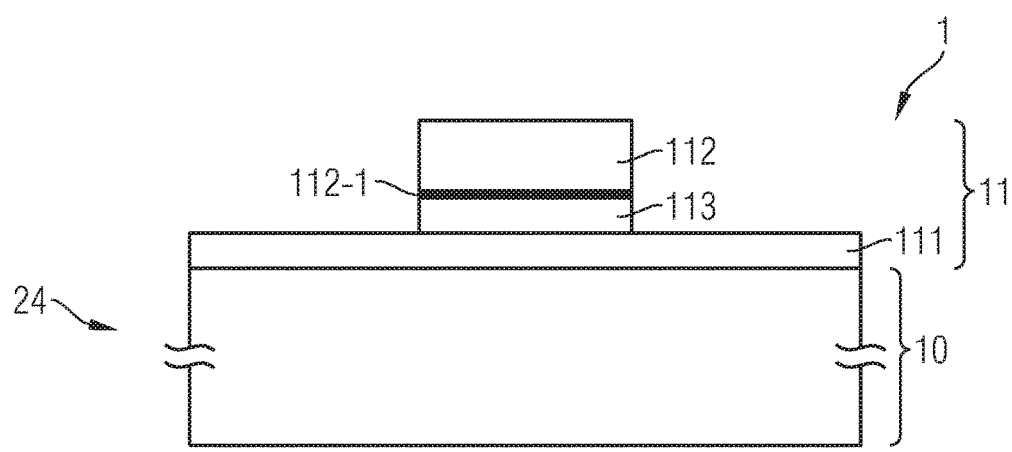

FIG. 4 schematically illustrates different stages of a power semiconductor device processing method 2 by means of a respective illustration of a section of a vertical cross-section of a semiconductor device 1 in accordance with one or more embodiments.

The method 2 may include providing, in step 21, a semiconductor structure 10 that has a surface 10-1 and, creating, in a subsequent step, a first load terminal structure 11 on top of the surface 10-1.

Said creating of the first load terminal structure 11 may include forming, in step 22, a conductive layer 111 that is in contact with a semiconductor structure 10 at said surface 10-1. For example, forming the conductive layer 111 may include forming a diffusion barrier 111-2 at the surface 10-1 of the semiconductor structure 10. Further, forming the conductive layer 111 may include forming a metallization 111-1 on top of the diffusion barrier 111-2.

Forming the metallization 111-1 may include carrying out a chemical vapor deposition and/or a sputtering processing step.

In a next step 23, at least one support block 113 may be deposited on top of the conductive layer 111. This step may involve depositing a material that exhibits a greater hardness as compared to the conductive layer 111, e.g., as compared due to the mean hardness of the metallization 111-1 and the diffusion barrier 111-2. For example, the hardness of the deposited support block 113 is at least twice as great as the hardness of a conductive layer 111, e.g., at least three times greater or even four times greater than the conductive layer 111.

Depositing the at least one support block 113 within step 23 may include using a mask (not illustrated) for structuring the at least one support block 113. This optional aspect shall be explained in more detail with respect to FIG. 3, which schematically and exemplarily illustrates a horizontal projection on a processed power semiconductor device 1 in accordance with one or more embodiments. Accordingly, the provided semiconductor body 10 may comprise an active region 1-1 and a non-active edge structure 1-2 that may surround the active region 1-1. The active region 1-1 may be configured to conduct the load current whereas, in accordance with one or more embodiments, the non-active edge structure 1-2 is not used for the purpose of carrying the load current. For example the active region 1-1 comprises one or more of the above mentioned active cells, such as diode cells and/or transistor cells that may implement the capability of the semiconductor structure 10 to conduct a controlled load current and the non-active edge structure 1-2 may comprise a junction termination region of the device 1.

Using the mask within step 23 may occur such that the at least one support block 113 is only provided on top of the active region 1-1 and not on top of the non-active edge structure 1-2. For example, the at least one support block 113 is only provided in regions that are later to be contacted by one or more bond wires that are used to feed the load current into the semiconductor structure 10 and/or, respectively, to couple the load current out of the semiconductor structure 10.

In an embodiment, the support block 113 exhibits a cross-section, e.g., a cross-section in parallel to each of the first lateral direction X and the second lateral direction Y, e.g. a cross-section perpendicular to the direction of the flow of the load current, wherein said cross-section may have an area that is within a range of two times to ten times of the area of the cross-section of the at least one bond wire 3. The area of said cross-section of the support block 113 may be identical to an area of a surface of the support block 113.

Further, as stated above, the support block 113 may exhibit a cross-section having an area being within a range of 5% to 95% of the total surface area of the conductive layer 111, wherein said cross-section may be in parallel to the surface of the conductive layer 111.

Thus, within step 23, more than only one support block 113 may be provided, wherein each of the support blocks 113 may exhibit a surface that is significantly smaller as compared to the total surface area of the conductive layer 111 that may, in accordance with one or more embodiments, cover the predominant part of the entire surface of the semiconductor structure 10. Thus, the one or more deposited support blocks 113 may form an island structure on top of the conductive layer 111, wherein each of the deposited support blocks 113 may exhibit said cross-section that may have an area that is within a range of two times to ten times of the area of the cross-section of the one bond wire 3 or, respectively, of the sum of all areas of the cross-sections of the more than one bond wires 3.

In a next step 24 of the embodiment of the illustrated method 2, a bonding block 112 may be mounted on top of the at least one support block 113. Said bonding block 112 may be configured to be contacted by an end 31 of a bond wire 3 and to receive at least a part of a load current from at least one of the bond wire 3 and the conductive layer 111.

Mounting the bonding block 112 within step 24 on top of the at least one support block 113 may include using a further mask (not illustrated), e.g., for structuring the bonding block 112 in the same manner as the at least one support block 112.

In another embodiment, as has already been indicated above, the bonding block 112 not only covers at least a portion of the support block 113, but also at least a portion of the conductive layer 111. For example, the bonding block 112 may cover each of the one or more support blocks 113 and further parts of the conductive layer 111 that is not covered by the one or more support blocks 113. The bonding block 112 may even laterally extend such that it borders the non-active edge structure 1-2 that may surround the active region 1-1. Accordingly, in FIG. 3, said at least one support block 113 is not illustrated as it may be entirely covered by the bonding block 112.

As it has already been explained above, method 2 may include forming said nitrogen atom zone that is arranged within at least one of the conductive layer 111 and the support block 113. For example, before said bonding block 112 is mounted, nitrogen may be provided at a surface 113-10 of the deposited at least one support block 113. For example, the deposited at least one support block 113 is subjected to a thermal annealing step, such as rapid thermal annealing step, before mounting of the bonding block 112 occurs.

In an embodiment, mounting the bonding block 112 within step 24 on top of the least one support block 113 may include providing a seed layer 112-1 on top of the support block 113 and, subsequently, galvanically depositing a metal on top of the seed layer 112-1. The deposited metal may be the same as the metal of the metallization 111-1 of the conductive layer 111. For example, mounting the bonding block 112 on top of the at least one support block 113 may thus include carrying out an electroplating step.

In an embodiment, said seed layer 112-1 is formed by providing a metal on top of the support block 113, e.g., TiW and Cu are deposited on top of the support block 113, e.g., by sputtering. For example, the support block 113 may be terminated by means of the seed layer 112-1, onto which the remaining section of the bonding block 112 may be mounted. Further, the hardness of the seed layer 112-1 may be smaller as compared to the hardness of the support block 113.

Figure 3:
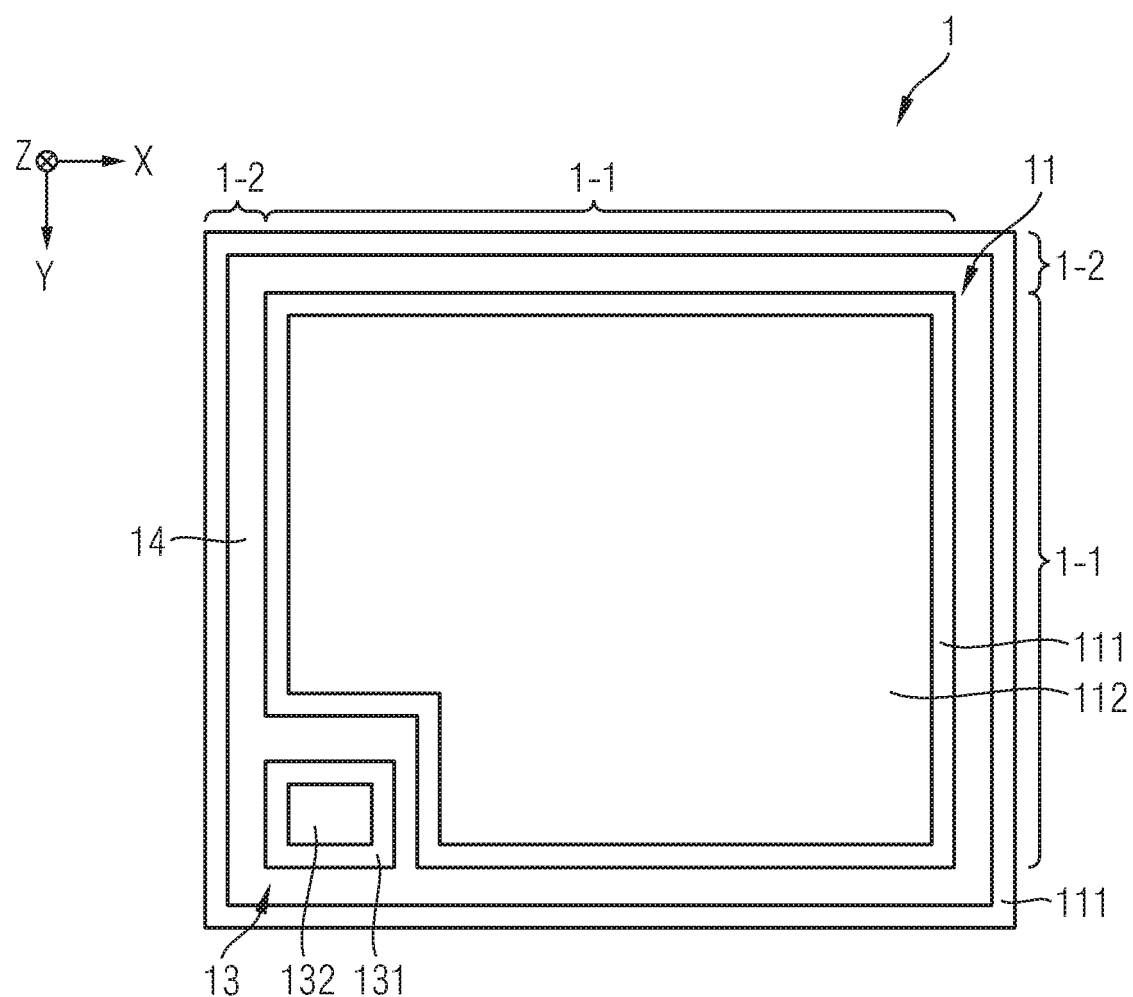
FIG. 3 schematically illustrates a section of a horizontal projection of a power semiconductor device in accordance with one or more embodiments.

In accordance with an embodiment, which shall now be explained with respect to FIG. 3, the semiconductor device 1 may further comprise a control terminal structure 13 that can be configured to control the load current path traversed by the load current within the semiconductor structure 10. For example, such control may occur in response to receiving a corresponding control signal that may be provided by, e.g., a driver unit (not illustrated), wherein such driver unit may be monolithically integrated within the semiconductor device 1 or, in another embodiment, arranged external of the semiconductor device 1. If arranged external of the semiconductor device 1, the driver unit may be electrically connected to the control terminal structure 13 in order to provide the control signal to the control terminal structure 13. The provided control signal may be, e.g., a control voltage that may be applied, e.g., between the control terminal structure 13 and one of the first load terminal structure 11 and the second load terminal structure 12. For example, in the latter embodiment, the control terminal structure 13 may be electrically insulated from each of the first load terminal structure 11, the second load terminal structure 12 and the semiconductor structure 10. In another embodiment, the provided control signal may be a control current that is fed into the semiconductor structure 10, e.g., in the event that the semiconductor structure 10 exhibits a thyristor structure or another current controlled power semiconductor structure.

In order to provide the control signal to the control terminal structure, also a bond wire may be used. To this end, the control terminal structure 13 may exhibit a similar set up as compared to the first load terminal structure 11 that has been exemplarily explained above with respect to FIGS. 1-5. Accordingly, the control terminal structure 13 may exhibit a conductive layer 131 and a bonding block 132 that is mounted on the conductive layer via a support block (not illustrated in FIG. 3). What has been stated above regarding the conductive layer 111, the bonding block 112 and the support block 113 of the first load terminal structure 11 as well as regarding the method of manufacturing such components of the first load terminal structure 11 may equally apply to the control terminal structure 13. Thus, within the present specification, the term "control terminal structure" can be within the scope of the term "first load terminal structure". The control terminal structure 13 may be separated from the first load terminal structure 11 by means of an intermediate structure 14, e.g., an insulating intermediate structure 14, formed by, e.g., imide.

The features of further embodiments are defined in the dependent claims. The features of the further embodiments and the features of the embodiments described above may be combined with each other performing additional embodiments, as long as the features are not explicitly described as being alternatively to each other.

For example, the first load terminal structure 11 exhibits a sufficiently high heat capacity in order to compensate for temperature peaks that may occur during operation of the semiconductor device 1, e.g., during transient electrical processes, such as short circuits or peak currents and can, thereby, be configured to avoid damages or even destruction of the semiconductor device 1 due to overheating.

Further, the first load terminal structure 11 may be configured to prevent metal, e.g., heavy metal, from diffusing into the semiconductor structure 10. For example, said exemplary mentioned diffusion barrier 111-2 may be employed to this end.

Further, the first load terminal structure 11 may exhibit a sufficiently high mechanical robustness in order to withstand high mechanical stress that may occur, e.g., during a bonding process. On top of the bonding block 112, a passivation layer may be deposited, wherein the passivation layer may comprise at least one of, e.g., $Si_3N_4$, NiP, Au and $Al_2O_3$.

For example, in a horizontal cross-section in parallel to a plane defined by the two lateral directions X and Y, the support block 113 may exhibit, e.g., a circular or a rectangular cross-section. Said above mentioned island structure that may come into being by locally depositing the one or more support blocks 113 that are, e.g., horizontally spaced apart from each other. Thus, the first load terminal structure 11 may also comprise more than one of the above mentioned electrically conductive stacks that are horizontally spaced apart from each other, since each of the distributed support blocks 113 may be covered by a respective bonding block 112, wherein it shall be understood that, as has been explained above, said bonding blocks 112 may be structured in the same manner as the support blocks 113 or, alternatively, by formed by a coherent, i.e., a monolithic bonding block 112 that covers more than one or even each of the distributed support blocks 113. In the latter embodiment, the bonding block 112 may thus rather exhibit the dimensions of a layer than those of a block. The locally deposited one or more support blocks 113 may allow for achieving a sufficient heat dissipation of the first load terminal structure 11, e.g., due to a lower thermal resistance, e.g., due to a reduced thermal interface area.

In an embodiment, the thickness T3 of the support block 113 is within the range of 0.1% to 20% of the total extension T1+T2+T3 of the conductive stack formed by the conductive layer 111, the bonding block 112 and the support block 113.

Further, the conductive stack of the first load terminal structure 11 or, respectively, each of the conductive stacks of the first load terminal structure 11 may exhibit more than only one support block 113, such as two support blocks 113 arranged on top of each other or vertically spaced apart from each other, or even more than two support blocks 113 arranged on top of each other or vertically spaced apart from each other. Each of such several support blocks, e.g., up to five support blocks, may exhibit the same thickness or different thicknesses. For example, if being vertically spaced apart from each other, the conductive stack may comprise one or more conductive intermediate blocks (not illustrated) that separate the support blocks 113 from each other, wherein the one or more conductive intermediate blocks may be made out of the same material as, e.g., one of the bonding block 112 or the conductive layer 111, e.g., its metallization 111-1.

Further, even though the drawings suggest that the first load terminal structure 11 can be arranged on a front side of the semiconductor device 1, it shall be understood that the first load terminal structure 11 including the support block 113 may be arranged on the backside of the semiconductor device 1. In other words, the support block 113 may also be provided below a backside metallization of the semiconductor device 1, wherein, at the backside of the semiconductor device 1, the support block 113 may be provided without using a mask, in accordance with one or more embodiments.

In the above, embodiments pertaining to semiconductor device processing methods were explained. For example, these semiconductor devices are based on silicon (Si).

Accordingly, a monocrystalline semiconductor region or layer, e.g., the semiconductor structure 10 of exemplary embodiments, can be a monocrystalline Si-region or Si-layer. In other embodiments, polycrystalline or amorphous silicon may be employed.

It should, however, be understood that the semiconductor structure 10 or, respectively, parts thereof can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of processing a power semiconductor device, the method comprising:
  providing a semiconductor structure having a surface,
    wherein the semiconductor structure comprises at least one active power semiconductor cell configured to conduct a load current through the semiconductor structure; and creating a first load terminal structure on top of the surface of the semiconductor structure, wherein the first load terminal structure is configured to conduct the load current, and wherein creating the first load terminal structure on top of the surface of the semiconductor structure comprises:
  forming a conductive layer that is in contact with the semiconductor structure at the surface of the semiconductor structure;
  depositing a support block on top of and in direct contact with the conductive layer; and
  mounting a bonding block on top of and in direct contact with the support block, wherein the bonding block is a single layer structure comprising copper,
wherein a hardness of the support block is greater than a hardness of the conductive layer and a hardness of the bonding block, and
the bonding block is configured to be contacted by an end of at least one bond wire and to receive at least a part of the load current from at least one of the at least one bond wire and the conductive layer,
wherein the support block and the bonding block are directly coupled together at an interface having a lateral area delineated by terminating ends of the interface, wherein the lateral area of the interface is entirely flat.

2. The method of claim 1, wherein forming the conductive layer includes forming a diffusion barrier at the surface of the semiconductor structure and forming a metallization on top of the diffusion barrier.

3. The method of claim 2, wherein the diffusion barrier comprises titanium tungsten (TiW).

4. The method of claim 1, wherein the bonding block and the conductive layer comprise copper.

5. The method of claim 1, wherein a thickness of the support block in a direction parallel to a flow of the load current is at least a tenth smaller than a thickness of the bonding block in the same direction.

6. The method of claim 5, wherein a thickness of the conductive layer in a direction parallel to a flow of the load current is at least a tenth smaller than a thickness of the bonding block in the same direction.

7. The method of claim 1, further comprising:
  forming a zone exhibiting nitrogen atoms by carrying out a thermal annealing step,
  wherein forming the conductive layer includes forming a diffusion barrier at the surface of the semiconductor structure and forming a metallization layer on top of the diffusion barrier, the metallization layer being interposed between the diffusion barrier and the support block,
  wherein the diffusion barrier comprises the zone exhibiting nitrogen atoms,
  wherein the support block is formed on top of and in direct contact with the metallization layer, and
  wherein the hardness of the support block is greater than a hardness of the metallization layer.

8. The method of claim 7, wherein the diffusion barrier further comprises titanium tungsten (TiW).

9. The method of claim 8, wherein:
  forming the zone exhibiting nitrogen atoms comprises forming the zone exhibiting nitrogen atoms in the diffusion barrier, and
  forming the diffusion barrier comprises depositing the TiW of the diffusion barrier on top of the zone exhibiting nitrogen atoms after the zone exhibiting nitrogen atoms is formed.

10. The method of claim 7, wherein the semiconductor structure is a semiconductor substrate comprising the surface of the semiconductor structure, and the diffusion barrier is in direct contact with the semiconductor substrate at the surface of the semiconductor structure.

11. The method of claim 1, wherein:
  the semiconductor structure comprises a non-active edge structure and an active region comprising the at least one active power semiconductor cell, wherein the active region is delimited by a first lateral boundary defined by the non-active edge structure that laterally surrounds the active region,
  the support block and the bonding block are entirely confined to an area arranged over the active region and do not extend laterally over the non-active edge structure,
  wherein the non-active edge structure is void of active power semiconductor cells and comprises a junction termination region.

12. The method of claim 11, further comprising:
  providing an insulating intermediate structure on top of and in direct contact with the semiconductor structure,
  wherein the insulating intermediate structure laterally surrounds the conductive layer and is in lateral contact with the conductive layer thereby forming a second lateral boundary therebetween,
  wherein the insulating intermediate structure vertically overlaps with the non-active edge structure, wherein the second lateral boundary is vertically aligned with the first lateral boundary.

13. The method of claim 12, wherein the conductive layer is in direct contact with the active region of the semiconductor structure, wherein the active region of the semiconductor structure is made entirely of at least one semiconductor material and dopants.

14. The method of claim 1, wherein:
  the bonding block and the conductive layer comprise copper, and the method further comprises:
  forming at least one barrier layer between the surface of the semiconductor structure and the conductive layer, wherein one of the at least one barrier layer is formed at and in direct contact with the active region of the semiconductor structure and one of the at least one barrier layer is formed in direct contact with the conductive layer,
  wherein each of the at least one barrier layer comprises titanium tungsten (TiW) or tungsten (W), and
  wherein the active region of the semiconductor structure is made entirely of at least one semiconductor material and dopants.

15. The method of claim 14, further comprising:
  forming a second load terminal structure, wherein providing the semiconductor structure comprises forming the semiconductor structure on top of and in direct contact with the second load terminal structure,
  wherein the power semiconductor device is configured to receive the load current from the bonding block and output the load current from the second load terminal structure, or the power semiconductor device is configured to receive the load current from the second load terminal structure and output the load current from the bonding block.

16. The method of claim 11, wherein a lateral dimension of the bonding block defined by two opposing lateral sides of the bonding block is greater than a lateral dimension of the support block defined by two opposing lateral sides of the support block such that an entire lateral area of the bonding block extends beyond an entire lateral area of the support block.

17. The method of claim 16, wherein the lateral dimension of the bonding block extends to a vertical extension of the lateral boundary defined by the non-active edge structure, and the lateral dimension of the support block does not extend to the vertical extension of the lateral boundary defined by the non-active edge structure.

18. The method of claim 1, further comprising:
bonding the end of the at least one bond wire directly to the bonding block,
wherein the bonding block and the conductive layer comprise copper, and
wherein a thickness of the conductive layer in a direction parallel to a flow of the load current is at least a tenth smaller than a thickness of the bonding block in the same direction.

19. The method of claim 18, wherein the support block comprises a plurality of different metal layers stacked contiguously on top of each other, each of the plurality of different metal layers having a hardness greater than the hardness of each of the conductive layer and the bonding block.

20. The method of claim 19, wherein the plurality of different metal layers of the support block comprise a first metal layer and a second metal layer, wherein an entire upper surface of the first metal layer is in direct contact with a lower surface of the second metal layer with no intervening elements therebetween.

21. The method of claim 20, wherein:
the first metal layer is made of a first one of titanium, tungsten, titanium tungsten, titanium nitride, tantalum, and tantalum nitride, and
the second metal layer is made of a second one of titanium, tungsten, titanium tungsten, titanium nitride, tantalum, and tantalum nitride.

22. The method of claim 1, further comprising:
bonding the end of the at least one bond wire directly to the bonding block.

23. The method of claim 1, further comprising:
creating a control terminal structure on top of the surface of the semiconductor structure, wherein the control terminal structure is configured to control the load current, and wherein creating the control terminal structure on top of the surface of the semiconductor structure comprises:
forming a control terminal conductive layer that is in contact with the semiconductor structure at the surface of the semiconductor structure;
depositing at least one control terminal support block on top of and in direct contact with the control terminal conductive layer; and
mounting a control terminal bonding block on top of and in direct contact with the at least one control terminal support block, wherein the control terminal bonding block is a single layer structure comprising copper,
wherein the at least one control terminal support block exhibits a hardness greater than the hardness of each of the control terminal conductive layer and the control terminal bonding block, and the control terminal bonding block is configured to be contacted by an end of at least one control terminal bond wire and to receive a control signal.

24. The method of claim 23, further comprising:
providing an insulating intermediate structure laterally between and in lateral contact with the control terminal structure and the first load terminal structure.

25. The method of claim 24, wherein:
the semiconductor structure comprises a non-active edge structure and an active region comprising the at least one active power semiconductor cell, wherein the active region is delimited by a first lateral boundary defined by the non-active edge structure that laterally surrounds the active region,
the at least one control terminal support block and the control terminal bonding block are entirely confined to an area arranged over the active region and do not extend laterally over the non-active edge structure, and
the non-active edge structure is void of active power semiconductor cells and comprises a junction termination region.

26. The method of claim 25, wherein:
the insulating intermediate structure is provided on top of and in direct contact with the semiconductor structure,
the insulating intermediate structure comprises a portion that laterally surrounds the conductive layer of the first load terminal structure and is in lateral contact with the conductive layer of the first load terminal structure thereby forming a second lateral boundary therebetween, and
the portion of the insulating intermediate structure vertically overlaps with the non-active edge structure, wherein the second lateral boundary is vertically aligned with the first lateral boundary.

27. The method of claim 1, wherein:
the support block includes and is delineated by a support block upper main surface, a support block lower main surface arranged opposite to the support block upper main surface, a support block first side surface, and a support block second side surface arranged opposite to the support block first side surface,
the bonding block includes and is delineated by a bonding block upper main surface, a bonding block lower main surface arranged opposite to the bonding block upper main surface, a bonding block first side surface, and a bonding block second side surface arranged opposite to the bonding block first side surface,
the support block upper main surface faces and is coupled to the bonding block lower main surface, and
the support block upper main surface and the bonding block lower main surface are entirely flat.

28. The method of claim 27, wherein:
wherein the lateral area of the interface has a lateral dimension extending from the support block first side surface to the support block second side surface, and
the interface is flat along an entirety of its lateral dimension.

29. The method of claim 27, wherein:
the support block lower main surface face is entirely flat.

30. The method of claim 29, wherein:
the conductive layer comprises a conductive layer upper main surface to which the support block lower main surface is coupled, and the conductive layer upper main surface is entirely flat.

31. The method of claim 27, wherein creating the first load terminal structure on top of the surface of the semiconductor structure comprises:

depositing a further support block on top of and in direct contact with the conductive layer; and mounting a further bonding block on top of and in direct contact with the further support block, wherein the further bonding block is a single layer structure comprising copper, wherein the further support block and the further bonding block are laterally separated from the bonding block and the support block, wherein a hardness of the further support block is greater than a hardness of the conductive layer and a hardness of the further bonding block, and wherein the further bonding block is configured to be contacted by an end of at least one further bond wire and to receive at least a further part of the load current from at least one of the at least one further bond wire and the conductive layer.

32. The method of claim 31, wherein the bonding block and the support block form a first conductive island stack and the further support block and the further bonding block form a second conductive island stack that is laterally separated from the first conductive island stack.

33. The method of claim 31, wherein the further bonding block support block and the further bonding block bonding block are directly coupled together at a further interface having a lateral area delineated by terminating ends of the further interface, wherein the lateral area of the further interface is entirely flat.

34. A method of processing a power semiconductor device, the method comprising:
providing a semiconductor structure having a surface, wherein the semiconductor structure comprises at least one active power semiconductor cell configured to conduct a load current through the semiconductor structure; and
creating a first load terminal structure on top of the surface of the semiconductor structure, wherein the first load terminal structure is configured to conduct the load current, and wherein creating the first load terminal structure on top of the surface of the semiconductor structure comprises:
forming a conductive layer that is in contact with the semiconductor structure at the surface of the semiconductor structure;
forming a first conductive island stack, including depositing a first support block on top of and in direct contact with the conductive layer, and mounting a first bonding block on top of and in direct contact with the first support block, wherein the first bonding block is a single layer structure comprising copper; and
forming a second conductive island stack, including depositing a second support block on top of and in direct contact with the conductive layer, and mounting a second bonding block on top of and in direct contact with the second support block, wherein the second bonding block is a single layer structure comprising copper,
wherein a hardness of the first support block is greater than a hardness of the conductive layer and a hardness of the first bonding block, and the first bonding block is configured to be contacted by an end of a first bond wire and to receive at least a part of the load current from at least one of the at least one bond wire and the conductive layer, wherein a hardness of the second support block is greater than a hardness of the conductive layer and a hardness of the second bonding block, and the second bonding block is configured to be contacted by an end of a second bond wire and to receive at least a further part of the load current from at least one of the second bond wire and the conductive layer.

35. The method of claim 34, wherein:
the first support block and the first bonding block are directly coupled together at a first interface having a lateral area delineated by terminating ends of the first interface, wherein the lateral area of the first interface is entirely flat, and
the second support block and the second bonding block are directly coupled together at a second interface having a lateral area delineated by terminating ends of the second interface, wherein the lateral area of the second interface is entirely flat.

36. A method of processing a power semiconductor device, the method comprising:
providing a semiconductor structure having a surface, wherein the semiconductor structure comprises at least one active power semiconductor cell configured to conduct a load current through the semiconductor structure; and
creating a first load terminal structure on top of the surface of the semiconductor structure, wherein the first load terminal structure is configured to conduct the load current, and wherein creating the first load terminal structure on top of the surface of the semiconductor structure comprises:
forming a conductive layer that is in contact with the semiconductor structure at the surface of the semiconductor structure;
depositing a support block on top of and in direct contact with the conductive layer; and
mounting a bonding block on top of and in direct contact with the support block, wherein the bonding block comprises copper,
wherein a hardness of the support block is greater than a hardness of the conductive layer and a hardness of the bonding block, and
the bonding block is configured to be contacted by an end of at least one bond wire and to receive at least a part of the load current from at least one of the at least one bond wire and the conductive layer,
wherein the support block and the bonding block are directly coupled together at an interface having a lateral area delineated by terminating ends of the interface, wherein the lateral area of the interface is entirely flat.

37. The method of claim 36, wherein the support block comprises a metal layer made of one of titanium, tungsten, titanium tungsten, titanium nitride, tantalum, or tantalum nitride.

* * * * *